United States Patent [19]
Yedinak et al.

[11] Patent Number: 5,872,028
[45] Date of Patent: Feb. 16, 1999

[54] METHOD OF FORMING POWER SEMICONDUCTOR DEVICES WITH CONTROLLABLE INTEGRATED BUFFER

[75] Inventors: Joseph Andrew Yedinak, Mountaintop; Anup Bhalla; Jeffrey Allen Webster, both of Wilkes-Barre; Joseph Leonard Cumbo, Exeter, all of Pa.

[73] Assignee: Harris Corporation, Melbourne, Fla.

[21] Appl. No.: 708,712

[22] Filed: Sep. 5, 1996

[51] Int. Cl.⁶ ................................................. H01L 21/332
[52] U.S. Cl. .......................................... 438/133; 438/627
[58] Field of Search ..................................... 438/133, 358, 438/369, 451, 627, 653, 438, 923, 302, 135; 257/302, 135

[56] References Cited

U.S. PATENT DOCUMENTS 5,479,552  12/1995  Kitamura et al. ........................ 385/132
5,703,385  1/1998  Zambrano .............................. 257/212

FOREIGN PATENT DOCUMENTS 406075195A  10/1992  Japan .

*Primary Examiner*—Charles Bowers
*Assistant Examiner*—Craig Thompson
*Attorney, Agent, or Firm*—Rogers & Killeen

[57] ABSTRACT

A method of manufacturing a semiconductor device and device in which a sacrificial N shelf layer is grown on a P+ semiconductor substrate to contain the out-diffusion of dopant from the substrate. An N+ buffer layer is grown on the N shelf layer and an N– epitaxial layer is grown on the N+ buffer layer. The presence of the N shelf layer, which is consumed by the substrate dopant during further device fabrication, allows the integrated dopant level of the N+ buffer layer to be accurately controlled in the finished device.

13 Claims, 1 Drawing Sheet

METHOD OF FORMING POWER SEMICONDUCTOR DEVICES WITH CONTROLLABLE INTEGRATED BUFFER

BACKGROUND OF THE INVENTION

The present invention relates to semiconductor devices, and more specifically to a method of fabricating a power semiconductor device and a semiconductor high voltage switch in which a sacrificial N shelf layer is grown on a P+semiconductor substrate to alleviate a change in integrated dopant level of an N+buffer layer atop the shelf layer due to out-diffusion of dopant from the substrate.

Semiconductor devices, such as high voltage switches (e.g., 600 to 1200 volt Insulated Gate Bipolar Transistors), are manufactured to meet predetermined specifications which are desirably narrowly defined (that is, there is little tolerance for variation in the finished devices.) However, device fabrication processing introduces variations which may cause some devices to fail to meet specifications, reducing device yield. By way of example, one such specification is the 1200V IGBT conductivity measurement, collector emitter saturation voltage $V_{CE(SAT)}$ (sometimes denoted $V_{CE(ON)}$), which is desirably kept low—on the order of 2.0 to 3.0 volts—and tightly distributed about a desired voltage.

In some devices, such as high voltage switches, $V_{CE(SAT)}$ may vary unacceptably so as to cause low device yields, although it has been found that the severity of the $V_{CE(SAT)}$ variations may be controlled, at least in part, during the device manufacturing process. For example and with reference to FIG. 1, the manufacture of high voltage switches may include growing an N+ buffer layer 12 between a P+ substrate 14 and an N– epitaxial layer 16 (the structure shown is a portion of a switch, the remainder of the switch structure being unrelated to the present invention and known in the art.) It has been found that the $V_{CE(SAT)}$ variations get worse as the starting dopant level and thickness of the buffer layer 12 increase, especially after lifetime control is performed (integrated dopant level is a term also used in this regard, where integrated dopant level is the integral of the layer dopant level over layer thickness.) Irradiation or any other method of lifetime control of a semiconductor device during fabrication affects the variability of some of its characteristics. Irradiation is used to control carrier lifetime, typically occurs late in the device fabrication process, and inevitably causes some variability in device characteristics. The variability is amplified if the dopant level and thickness of buffer layer 12 also vary so as to cause the integrated dopant level to vary. Therefore it is desirable to control the buffer layer 12 integrated dopant level so that all devices have characteristics which are tightly distributed about desired levels.

As will be appreciated, the desired integrated dopant level of buffer layer 12 in the finished semiconductor device drives the selection of the starting dopant level, thickness and irradiation dose, and there are trade-offs which can be made to achieve the desired result. For example, the irradiation dose may be kept low and the starting dopant level and/or thickness increased commensurately. The starting dopant level and/or thickness is increased because during device fabrication (e.g., epitaxial growth, high temperature drives) dopant from substrate 14 out-diffuses into buffer layer 12 reducing its thickness and/or dopant level (that is, some of the N type region is overwhelmed by P type dopant.) In the prior art the starting dopant level and layer thickness thus are initially larger than needed to account for this shrinkage. It would be desirable to avoid the higher starting dopant level and increased buffer layer thickness (and attendant high integrated dopant level) while maintaining a low irradiation dose to make the process of epitaxial growth more manufacturable.

If the effect of the out-diffusion on the N+ buffer layer can be reduced (the out-diffusion itself cannot be stopped), the starting dopant level and buffer layer thickness (and irradiation dose) may be kept low. When these are kept low the $V_{CE(SAT)}$ variations may be controlled so that the specification for $V_{CE(SAT)}$ and other characteristics may be met more easily in the finished product.

By way of further background, semiconductor switches desirably have a fast turn-off capability, in some power devices several hundred nanoseconds. One of the factors determining turn-off speed is the doping level adjacent the PN junction 18 between substrate 14 and buffer layer 12. High doping levels in this area allow the switch to operate with acceptably fast turnoff speeds, while low doping levels adjacent PN junction 18 do not.

The prior art has not been able to mass produce such epitaxial-based and lifetime controlled semiconductor power switches which have $V_{CE(SAT)}$S which are tightly distributed about a desired voltage, and which have fast turn-off speeds. The tight control of the integrated dopant level of N+ buffer layer 12 has been incompatible with the need to provide high dopant levels adjacent PN junction 18.

Accordingly, it is an object of the present invention to provide a novel method of manufacturing a semiconductor device which obviates the problems of the prior art.

It is another object of the present invention to provide a novel method of manufacturing a semiconductor device in which a sacrificial shelf layer is grown on a substrate to alleviate a reduction in integrated dopant level in a buffer layer atop the shelf layer due to out-diffusion of dopant from the substrate.

It is yet another object of the present invention to provide a novel method of reducing variability of $V_{CE(SAT)}$in a semiconductor device caused during manufacture of the device by growing a shelf layer between a substrate and an overlying buffer layer, the shelf layer being provided with a dopant level less than a dopant level of the overlying buffer layer so that the shelf layer absorbs out-diffusion of dopant from the substrate during subsequent device processing with little change in the net N+ buffer integrated dopant level.

It is still another object of the present invention to provide a novel method of alleviating a reduction in the integrated dopant level of an N+ buffer layer by growing an N shelf layer between the N+ buffer layer and the substrate, and doping the shelf layer to a level one to two orders of magnitude less than the dopant level of the buffer layer and of the dopant level of the substrate.

It is a further object of the present invention to provide a novel method of manufacturing a semiconductor device in which a desired integrated dopant level is provided in a thinner N+ buffer layer than available in the prior art while preventing P+ substrate diffusion through the N+buffer layer.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

In an embodiment of the present invention, a semiconductor device is provided with a sacrificial shelf layer which is grown on a semiconductor substrate to alleviate a reduction in integrated dopant level in a buffer layer atop the shelf layer due to out-diffusion of dopant from the substrate. The shelf layer absorbs the out-diffusing dopant from the substrate and all but disappears from the finished device. The width of the shelf layer may be determined from the total thermal budget of epitaxial growth for the device and subsequent processing so that the shelf layer may be substantially consumed. The exact resistivity of the shelf layer is not critical but should be greater than the resistivities of the adjacent layers (the substrate and the buffer layer), and desirably is not so high or low as to cause problems for epitaxial reactors in which the layers are grown, or to affect the integrated dopant level of the buffer layer by its consumption.

Figure 1:
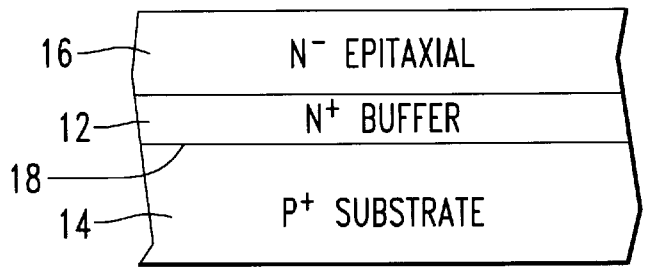
FIG. 1 is a vertical cross-section of a portion of prior art semiconductor device.
Figure 2:
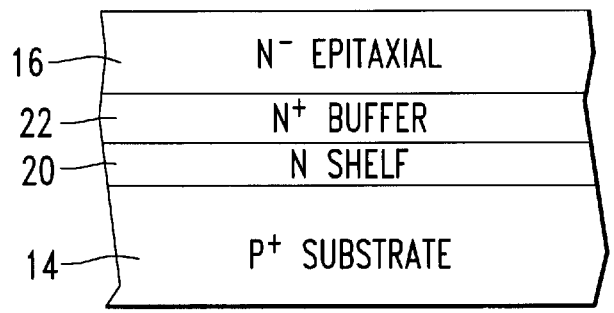
FIG. 2 is a vertical cross-section of a portion of a semiconductor device illustrating the step of providing a shelf layer in an embodiment of the present invention.

In a preferred embodiment for a high voltage switch and with reference to FIG. 2, an N shelf layer 20 is epitaxially grown on a P+semiconductor substrate 14 and an N+buffer layer 22 is epitaxially grown on substrate 14. The shelf layer 20 is doped to a level less than the dopant levels of the adjacent buffer layer 22 and substrate 14, preferably one to two orders of magnitude less than the dopant levels of buffer layer 22 and substrate 14. For example, shelf layer 20 may be doped to a level which is less than about 5% of the dopant level of buffer layer 22.

Shelf layer 20 absorbs dopant from substrate 14 and from buffer layer 22 which out-diffuses during the steps following formation of shelf layer 20, namely the steps of growing buffer layer 22 and epitaxial layer 16 and subsequent high temperature wafer processing (subsequent high temperature wafer processing is not part of the present invention and is known to those of skill in the art.) The dopant level and thickness of shelf layer 20 is selected so that shelf layer 20 is consumed by the out-diffusing dopant, and so that shelf layer 20 is not present or is insubstantial in the finished semiconductor device. As will be appreciated, substantial remnants of shelf layer 20 in the finished device may undesirably slow down the turn-off current tail of the device switching waveform.

Figure 3:
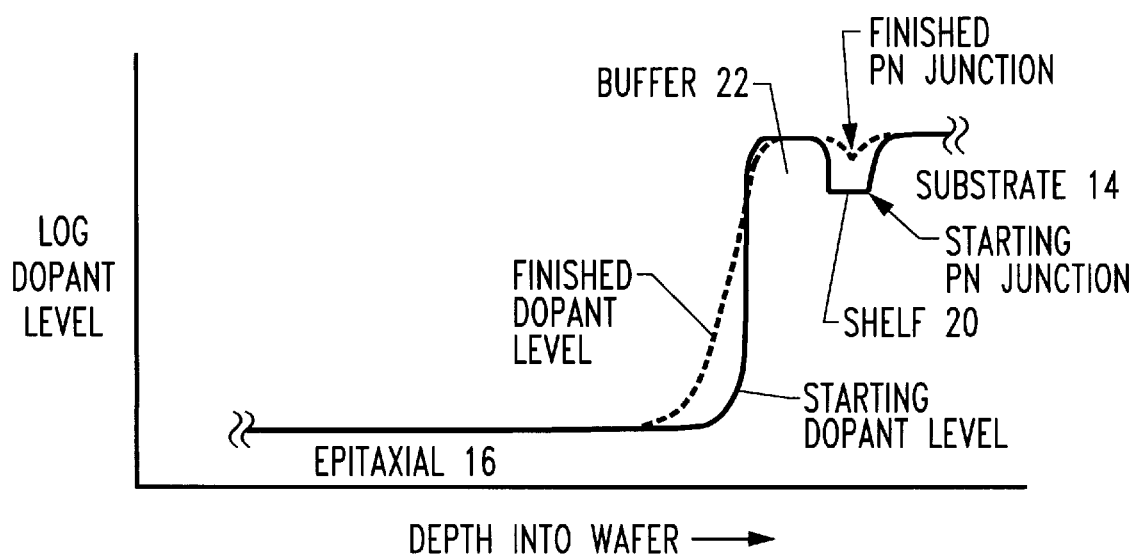
FIG. 3 is a graph depicting log dopant level versus semiconductor device thickness for the embodiment of FIG. 2.

The absorption of dopant by shelf layer 20 may be more clearly seen in FIG. 3 in which the solid line illustrates starting dopant levels and thicknesses and the dashed line illustrates finished dopant levels and thicknesses. Shelf layer 20 all but disappears due to out-diffusion from substrate 14 and buffer layer 22. Further, as is apparent, the location of the PN junction between substrate 14 and buffer layer 22 moves from the edge of shelf layer 20 to a position closer to buffer layer 22. Some dopant has also out-diffused from buffer layer 22 to epitaxial layer 16, although the change in thickness of buffer layer 22 attributable to this is slight if a slow diffusing N− type dopant is used so that the integrated dopant level of buffer layer 22 is substantially unchanged.

The out-diffusing to shelf layer 20 which causes it to almost completely disappear may leave a small remnant, such as the slight dip in dopant level at the new PN junction, although this dip is considered inconsequential to device operation. For example, in a simulation of the finished dopant levels of a 1200 volt device with a 2.1 volt forward drop, a turn-off time ($t_{FALL}$ at 150° C.) of about 300ns was achieved, while it was found that the shelf layer, if allowed to remain in the finished device, would have provided a turn-off time of about 420ns (the 420ns was achieved in a worst-case scenario which can be avoided in practice so as reach the desired turn-off time of about 300ns.)

Two results are apparent. The integrated dopant level of buffer layer 22 is substantially the same as the starting level, and thus there is no need to increase dopant level and thickness to compensate for subsequent shrinkage of this region. In addition, the dopant level adjacent the PN junction is high, thereby facilitating fast turn-off of the device.

The dopant level and thickness of shelf layer 20 may be selected based on the nature of the semiconductor device. In a high voltage switch, shelf layer 20 may be about 4 to 6 microns thick and have a dopant concentration of 1E16 to 5E16 atoms/cm$^3$, and the buffer layer may be about 4 to 10 microns thick and have a dopant concentration of 5E17 to 5E18 atoms/cm$^3$. The thickness and resistivity of epitaxial layer 16 depend on the voltage capability of the switch and may be about 90 to 100 microns thick and have a resistivity of 60 to 100 ohm-cm for a 1200 volt switch, and may be about 40 to 50 microns thick and have a resistivity of 30 to 40 ohm-cm for a 600 volt switch. Substrate 14 may be conventional and typically has a resistivity of less than or equal to 0.02 ohm-cm.

The present invention is not limited to these specific doping profiles and devices, and the method of the present invention may be used to stabilize a buffer layer, reduce variability of specified characteristics, such as $V_{CE(SAT)}$, in a variety of semiconductor devices. For example, the method may include the step of first establishing a starting dopant level and thickness for a layer and an irradiation does which are acceptable. This step may be accomplished conventionally by those of skill in the art based on design specifications of the device and need not be described for an understanding of the present invention. Thereafter, a shelf layer of first conductivity type may be grown on the substrate, the shelf layer being provided with a dopant concentration less than a dopant concentration of the adjacent layers, and then growing a further layer on the shelf layer with the established starting dopant level and thickness. The established irradiation dose may be provided thereafter as is conventional in processing such devices. The shelf layer absorbs the out-diffusion of dopant from the adjacent layers during growing of the subsequent epitaxial layers and high temperature processing so that the integrated dopant level of the layer is substantially the same as the starting dopant level and thickness.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof. For example, conductivity types opposite those shown in the drawings may be used without departing from the invention.

What is claimed is:

1. A method of alleviating a reduction of an integrated doping level of a buffer layer of a first conductivity type which is attributable to out-diffusion of a dopant from a semiconductor substrate of a second conductivity type, the buffer layer being between the substrate and an epitaxial layer of the first conductivity type in a finished semiconductor device, the method comprising the steps of:

(a) growing a shelf layer on the substrate;

(b) doping the shelf layer to a first conductivity type doping level less than the dopant level of the buffer layer and less than a dopant level of the substrate; and (c) substantially consuming the shelf layer with the out-diffusing dopant from the substrate so that the shelf layer is insubstantial in the finished semiconductor device.

2. The method of claim 1 wherein the step of doping the shelf layer comprises the step of doping the shelf layer to a level between one and two orders of magnitude less than the dopant level of the buffer layer.

3. The method of claim 1 wherein the step of doping the shelf layer comprises the step of doping the shelf layer to a level which is less than 5% of the dopant level of the buffer layer.

4. The method of claim 1 wherein the finished semiconductor device is a high voltage semiconductor switch, wherein the step of growing the shelf layer comprises the step of growing the shelf layer to a thickness of 4–6 $\mu$m, and further comprising the step of growing the buffer layer to a thickness of 4–10 $\mu$m.

5. The method of claim 4 wherein the step of doping the shelf layer further comprises the step of doping the shelf layer to an N– concentration of about 5E16 atoms/cm$^3$ (± one order of magnitude), and further comprising the steps of doping the buffer layer to an N+ concentration of about 1E18 atoms/cm$^3$ (± one order of magnitude) when the substrate is doped to a P+ concentration greater than 1E18 atoms/cm$^3$.

6. The method of claim 1 wherein the first conductivity type is N.

7. A method of reducing variations in $V_{CE(SAT)}$ in a semiconductor device caused during manufacture of the device by variations in a starting integrated dopant level in a buffer layer of a first conductivity type which is grown on a semiconductor substrate of a second conductivity type, the method comprising the steps of:

(a) establishing a starting integrated dopant level for the buffer layer which provides an acceptable $V_{CE(SAT)}$;

(b) growing a shelf layer of first conductivity type on the substrate, the shelf layer being provided with a dopant level less than a starting dopant level of the buffer layer; and (c) growing the buffer layer on the shelf layer with the established starting integrated dopant level, the shelf layer absorbing an out-diffusion of dopant from the substrate during growing of the buffer layer so that a integrated dopant level of the buffer layer after growing an epitaxial layer on the buffer layer is substantially the same as the starting integrated dopant level.

8. The method of claim 7 where the acceptable $V_{CE(SAT)}$ is less than 3.5 volts, and wherein the step of establishing a starting integrated dopant level comprises the step of setting a starting dopant level between 5E17 and 5E18 atoms/cm$^3$ and a starting thickness between 4 and 10 $\mu$m.

9. A method of forming an epitaxial layer on a semiconductor device substrate, the method comprising the steps of:

(a) growing a shelf layer of a first conductivity type on a semiconductor device substrate doped to a second conductivity type;

(b) growing a buffer layer of a first conductivity type on the shelf layer; and (c) growing an epitaxial layer of the first conductivity type on the buffer layer, wherein the substrate is given a first resistivity, the shelf layer a second resistivity greater than the first resistivity, the buffer layer a third resistivity less than the second resistivity, and the epitaxial layer a fourth resistivity greater than the third resistivity, wherein the shelf layer absorbs out-diffusing dopant from the substrate during growing of the epitaxial layer.

10. The method of claim 9 wherein the first resistivity is less than or equal to 0.02 ohm-cm, the second resistivity is 0.1 to 0.4 ohm-cm, the third resistivity is 0.1 to 0.3 ohm-cm and the fourth resistivity is more than 30 ohm-cm.

11. A method of manufacturing a semiconductor device comprising the steps of growing a sacrificial N shelf layer on a P+ semiconductor substrate and growing an N+ buffer layer on the shelf layer, the shelf layer alleviating a change in integrated dopant level in the buffer layer due to out-diffusion of dopant from the substrate.

12. A method of manufacturing a semiconductor device having an epitaxial layer on a buffer layer on a substrate comprising the steps of providing a sacrificial shelf layer between the buffer layer and the substrate, the shelf layer having a lower dopant level than a dopant level of the substrate for absorbing out-diffusing dopant from the substrate to thereby facilitate control of an integrated dopant level of the buffer layer.

13. A method of manufacturing a semiconductor device having an epitaxial layer on a buffer layer on a substrate comprising the steps of providing a shelf layer between the buffer layer and the substrate, and providing the buffer layer with a desired integrated dopant level in a buffer layer thickness which would not prevent substrate diffusion through the buffer layer were it not for the presence of the shelf layer.

* * * * *